(12) United States Patent
De Jongh et al.

(10) Patent No.: US 7,525,330 B2
(45) Date of Patent: Apr. 28, 2009

(54) SEMICONDUCTOR DEVICE, CARD, SYSTEM, AND METHODS OF INITIALIZING AND CHECKING THE AUTHENTICITY AND THE IDENTITY OF THE SEMICONDUCTOR DEVICE

(75) Inventors: Petra Elisabeth De Jongh, Eindhoven (NL); Edwin Roks, Eindhoven (NL); Robertus Adrianus Maria Wolters, Eindhoven (NL); Hermanus Leonardus Peek, Eindhoven (NL)

(73) Assignee: NXP, B.V., Eindhoven (NL)

( * ) Notice: Subject to any disclaimer, the term of this patent is extended or adjusted under 35 U.S.C. 154(b) by 975 days.

(21) Appl. No.: 10/497,257

(22) PCT Filed: Nov. 28, 2002

(86) PCT No.: PCT/IB02/05050

§ 371 (c)(1), (2), (4) Date: May 27, 2004

(87) PCT Pub. No.: WO03/046986

PCT Pub. Date: Jun. 5, 2003

(65) Prior Publication Data

US 2005/0051351 A1   Mar. 10, 2005

(30) Foreign Application Priority Data

Nov. 28, 2001 (EP) .................................. 01204588

(51) Int. Cl.
*G01R 31/28* (2006.01)
*H01L 23/58* (2006.01)

(52) U.S. Cl. .................. 324/763; 257/679; 257/922

(58) Field of Classification Search ............ 324/763, 324/764; 713/194; 726/23, 35; 257/414, 257/415, 577, 679, 922, E21.705
See application file for complete search history.

(56) References Cited

U.S. PATENT DOCUMENTS

| 4,353,056 | A  | * | 10/1982 | Tsikos ................... 382/124 |
| 4,868,489 | A  | * | 9/1989  | Kowalski ................ 324/680 |
| 5,060,261 | A  | * | 10/1991 | Avenier et al. .......... 713/194 |
| 5,881,155 | A  | * | 3/1999  | Rigal ..................... 380/44 |
| 6,798,234 | B2 | * | 9/2004  | Laackmann et al. ...... 326/21 |
| 7,005,733 | B2 | * | 2/2006  | Kommerling et al. ..... 257/679 |
| 7,024,565 | B1 | * | 4/2006  | Beiley et al. ............ 713/194 |

* cited by examiner

*Primary Examiner*—Ernest F Karlsen
(74) *Attorney, Agent, or Firm*—Aaron Wexler

(57) ABSTRACT

The semiconductor device (11) of the invention comprises a circuit covered by a passivation structure (50). It is provided with a first and a second security element (12A, 12B) which comprise local areas of the passivation structure (50), and with a first and a second electrode (14,15). The security elements (12A, 12B) have a first and a second impedance, respectively, which impedances differ. This is realized in that the passivation structure has an effective dielectric constant that varies laterally over the circuit.

Actual values of the impedances are measured by measuring means and transferred to an access device by transferring means. The access device comprises or has access to a central database device for storing the impedances. The access device furthermore may compare the actual values with the stored values of the impedances in order to check the authenticity or the identity of the semiconductor device.

14 Claims, 4 Drawing Sheets

SEMICONDUCTOR DEVICE, CARD, SYSTEM, AND METHODS OF INITIALIZING AND CHECKING THE AUTHENTICITY AND THE IDENTITY OF THE SEMICONDUCTOR DEVICE

The invention relates to a semiconductor device provided with a circuit comprising an active element, which circuit is present at a side of a substrate and is covered by a passivation structure, which semiconductor device is further provided with a first security element comprising a local area of the passivation structure and having a first impedance.

The invention also relates to a system comprising a semiconductor device and an access device.

The invention further relates to a card provided with a semiconductor device. The invention further relates to a method of initializing a semiconductor device and to a method of checking the authenticity of a semiconductor device and to a method of identifying a semiconductor device.

Such a system, such a semiconductor device and such a smartcard are known from EP-A 300864. The first security element of the known device is a capacitor with two capacitor electrodes that are coupled capacitively together by the passivation structure. The device preferably comprises a plurality of security elements. On checking the authenticity of the device, a measured voltage is compared with a calculated reference voltage. If there is a difference, the authenticity is not recognized.

It is a disadvantage of the known device that the security elements may be circumvented. The security elements may be replaced by other structures with the same capacitance which do not interfere with the underlying circuit. Furthermore, a removal of the passivation structure and the electrodes in order to take a look at the circuit cannot be detected if the electrodes and the passivation structure are reapplied afterwards.

It is a first object of the invention to provide a semiconductor device of the kind mentioned in the opening paragraph, in which a removal of the passivation structure can be detected afterwards.

It is a second object of the invention to provide a system of the kind mentioned in the opening paragraph with which a removal of the passivation structure can be detected.

The first object is realized in that:
measuring means are present for measuring actual values of the first and the second impedance; and
transferring means are present for transferring the actual values to an external access device comprising or having access to a central database device.

The second object is realized in a system of a semiconductor device and an access device in which:
the semiconductor device according to the invention is present;
the access device comprises or has access to a central database device; and
the central database device comprises memory elements which are suitable to store actual values of the first and the second security elements as first and second reference values, respectively.

In the system according to the invention, the semiconductor device has security elements with impedances that are dependent on the constitution of the passivation structure. The difference in impedance is thus related to a physically implemented feature. The constitution of the passivation structure may be varied over the circuit in several ways, as will be explained with reference to the semiconductor device. A removal of the passivation structure and a subsequent renewed application will lead, under normal circumstances, to a variation of at least one of the impedances of the security elements. The correctness of the actual values, and hence the authenticity of the semiconductor device, can be checked by comparison with data that are only present externally to the semiconductor device, for example in the central database device that is part of or is connected to the access device. Alternatively, the identity of the semiconductor device may be identified by comparison with said data. A usual criterion for identification, such as an account number, may be used for a check of the authenticity of the user.

In the semiconductor device of the invention, the actual values are not stored in a memory on the semiconductor device, but are instead transferred to the external access device. This is considered to be an advantage for reasons of security. Such a memory could be used for checking whether a reapplied passivation structure fits the original data. Also, a memory or interconnect design of the device could be modified so as to provide the correct actual values to an external device, even though the passivation structure were removed. In order to realize its proposed use, the semiconductor device of the invention has three features: a passivation structure that in principle cannot be removed and replaced without a change in the impedances of the security elements; measuring means for measuring actual values of said impedances; and transferring means for transferring said actual values to the access device.

The implementation of the measuring means will depend on the specific type of impedance to be measured. If the capacitance is measured, measuring means as known from the field of fingerprint sensors may be used. Such measuring means are, for example, the totality of drive means and sensing means as known from U.S. Pat. No. 5,325,442. Alternatively, especially if the number of security elements is relatively small, these may be measured one after the other with a conventional circuit wherein the measurement apparatus is placed in parallel to the impedance. It is being understood, in the context of this patent application, that the measurement of the actual value includes the determination of any parameter indicative thereof, or representing it or corresponding to it. As even a dielectric constant can be measured at different frequencies with different results, it will be clear that this actual value need not to be a value that can be obtained independently anywhere else. However, it is a value measured actually; and if the measurement is repeated in a device that has not been attacked under the same conditions, it must provide the same actual value.

In a preferred implementation, the measuring means comprise an oscillator and a binary counter. With the oscillator, the imaginary part of the impedance of a chosen security element can be measured, which results in a signal with a frequency that depends on said part of the impedance. The binary counter will compare this frequency with a standard frequency. The advantage of this implementation lies in its use of standard components, such as oscillators and binary counters. These are present in the integrated circuit already, and can be applied as measuring means. Alternatively and preferably, additional oscillators and binary counters may be added.

In order to increase the specificity of the measurement of the measuring means, a second oscillator and a processor function may be added. The second oscillator will provide an oscillation at a different frequency. In fact, a reapplied passivation structure must have the same behaviour as the original passivation structure, not only at one frequency, but also at the second frequency.

In another embodiment, the impedance can be measured by feeding into the security element a square wave of known frequency and amplitude generated within the semiconductor device. As a result the current is measured. The calculated actual value thereof is then digitized by means of an A/D-converter within the semiconductor device.

The transferring means are generally an antenna or any electrical connection to an antenna present on a card or the like of which the semiconductor device forms part. Alternatively, the transferring means may consist of contact pads allowing physical contact with the access device. Such transferring means, and the manner of transferring the actual values, are known to those skilled in the art.

In order to improve the security while transferring the actual values, it is preferred that algorithm means are present for modifying the actual values as measured into the actual values as transferred. The algorithm means is for instance constituted by a microprocessor. Alternatively, it may be a circuit wherein the data format of the actual values is adapted.

In a preferred embodiment, the passivation structure has an effective dielectric constant that varies laterally over the circuit, such that the first impedance is different from the second impedance. The term 'effective dielectric constant' is used in the sense that it is a property of a particular layer or stack of layers, each of which may be a mixture of materials. The term is further means to include any conductivity and magnetic permeability component, that are reflected in actual values as measured. This constitution may be varied in several ways. A first example is that the thickness of the passivation structure varies over the circuit. A second example is that the passivation structure comprises at least two layers with a substantially rough interface. Also, the layers may be partially mixed, or be locally modified. Furthermore, the passivation structure may consist of a multilayer stack.

The first and second security elements may be of the same kind—for example a capacitor, a resistor, an inductor, an LC-circuit, a transformer,—but also of different kinds. They may furthermore be hidden in a layer comprising a large number of other structures, such as interconnect lines. The first and second impedances may furthermore be measured at different frequencies.

Preferably, the semiconductor device comprises a plurality of security elements, and the central database device comprises an associated plurality of corresponding memory elements. Preferably, the number is such that the complete surface of the passivation structure is covered with security elements. For practical reasons, these may be provided as an array of security elements. The provision of a plurality of security elements enhances the complexity of the passivation structure strongly.

In an advantageous embodiment, the passivation structure comprises a passivating layer and a security layer, which security layer comprises particles that are distributed inhomogeneously over the circuit. In this embodiment the security elements may have impedances which are dependent on the actual deposition process. The inhomogeneous distribution of particles may be realized in several forms: the security layer may contain particles of different sizes, of different compositions, of different shapes, of different orientations and in concentrations that vary over the circuit. Preferably, the particles have a size of the order of the local surface areas of the security elements. A consequence thereof is that the impedances of the individual security elements cannot be predicted. They will not be known before an initialization. This has the advantage that the memory elements will contain reference values that are practically unique and can be used for identification purposes. Another consequence of the deposition process dependent impedances is that it is practically impossible to provide the same security layer once it has been removed.

The security layer is preferably chosen such that it is extremely difficult to remove, and that it is not possible to look through it with any microscope. In an advantageous embodiment, it comprises a ceramic material and may be applied in a sol-gel process. An example of a security layer is based on monoaluminum phosphate, which is known from WO-A 99/65074. Other examples of such matrix materials include $TiO_2$, $SiO_2$ (to be applied from tetraethoxyorthosilicate) and spin-on polymers. Such a security layer may be applied on a passivating layer in order to assure that the active elements of the underlying circuit will not be contaminated. If the size of the particles is comparable to that of the local surface area of a security element, there will automatically be an inhomogeneous distribution. Alternatively, the distribution may for example be made inhomogeneous by application of an inhomogeneous suspension of the matrix material filled with particles.

The first and the second electrode of the first security element may have various shapes. If the first security element is—primarily—an inductor having one turn, the first and the second electrode may be connected via the one turn; i.e. they are part of the same metal line. If the first and second electrode are not part of the same metal line, they may be present at the same side or at both sides of the passivation structure. One of the electrodes may even be present inside the passivation structure, and other variants will be clear to the skilled person. If there are more than one security elements, and the second electrodes are connected to a ground plane, several second electrodes may be integrated into one. Especially if the second electrodes are present on top of the passivation structure, these second electrodes may be implemented as a substantially unpatterned layer that is connected to a ground plane at one point. Instead of a metal layer some other electrically conductive layer may be used, such as a layer of electrically conductive polymer or a layer comprising electrically conductive particles. Such an unpatterned conductive layer may also be used as an ESD-protection.

In a preferred embodiment, the passivation structure is present on top of a metal layer, which metal layer comprises the first and the second electrode. The first and the second electrode constitute a pair of interdigitated electrodes. In this embodiment the surface area of the electrodes is comparatively large, which is positive for the magnitude of the impedance. The embodiment is especially suitable for the measurement of the capacitive part of the impedance between the first and second electrodes. Large variations in capacitance can be realized through the choice of particles with a dielectric constant different from that or those of the main material or materials in the passivation structure. Thus, they may have a dielectric constant that is comparitively high, such as $BaTiO_3$, $SrTiO_3$, TiN, $WO_3$ or comparatively low, such as air (for example a pore), an organic dielectric material, or a porous alkyl-substituted $SiO_2$.

In a further embodiment, interconnects for connection of active elements in a desired pattern are present in the metal layer as well. It is an advantage of this embodiment that no additional metal layers need be deposited in order to provide the electrodes of the security elements. Another advantage is that the electrode can be hidden in the structure of interconnects, in that they are given substantially the same shape.

It is a third object of the invention to provide a card with an improved security. This object is achieved in that the semiconductor device of the invention is present. Due to the protection against reverse engineering offered by the semiconductor device and the system of the invention, this object is achieved in the card of the invention. The card of the invention is preferably a smartcard containing any financial or private data or giving access to any building or information. The safety requirements for such smartcards show a steady increase, which is related to the increasing confidence and use of these smartcards. Alternatively, the card may be a transponder-type of card that can be read out contactlessly. In that embodiment, an antenna will be present on the card, to which antenna the semiconductor device is connected. The card may also be a banknote. In this case the semiconductor device must be very thin. The improved passivation structure of the semiconductor device allows the number of interconnect layers to be reduced, thus reducing the cost price of the device. Another type of card is a SIM-card for a mobile phone.

It is a fourth object of the invention to provide a method of initializing the semiconductor device of the invention for the system of the invention. This object is realized in that:

actual values of the first and the second impedance are measured; and the actual values are transferred to the central database device to be stored as the first and the second reference value in the first and the second memory element respectively.

This method is not limited to a semiconductor device with a passivation structure of which the impedance is really unpredictable. In many cases, such as the case in which the passivation structure contains a layer filled with particles, only an average value of the impedance can be calculated. The measurement of the actual value and its storage as the first reference value renders it possible to obtain a much preciser first reference value. The semiconductor device may furthermore be re-initialized under certain circumstances. This is preferable if reuse is envisaged, for security purposes it is not. Such a reuse may be advantageous, for example, in the context of the use of semiconductor devices according to the invention for giving access to a building.

In an embodiment, a second actual value is measured at a second frequency. In order to realize an enhanced security it is preferable to measure the impedance at more than one frequency. As a consequence, this value should be measured and transferred to the access device for storage during initializing as well.

It is being recognized that before the actual values are transferred to the access device, it could be modified in accordance with an algorithm. For example, the actual value could be multiplied by an integer value so as to create a value that is in the range between 0 and 1000. Also, the actual value could be modified so as to create an integer or it could be digitized.

It is a fifth object of the invention to provide a method of checking the authenticity of a semiconductor device, which method can detect a removal and of the passivation structure and a reapplication thereof, and which method assumes that the semiconductor device has been initialized by the method of initialization of the invention. The method of checking the authenticity of the semiconductor device of the invention, which is provided with an identity, comprises the steps of:

measuring the actual value of the first impedance, transferring the actual value to the access device;

providing the identity of the semiconductor device to the central database device;

reading the first reference value corresponding to the semiconductor device, providing the first reference value from the central database device to the access device, and recognizing the authenticity of the semiconductor device, if the difference between the actual value and the first reference value is smaller than a predefined threshold value.

The method of the invention uses the features of the system of the invention. The identity of the semiconductor device may be a number or something else, and is generally provided automatically by the semiconductor device to the access device, without any specific action of a user.

It is noted here that under normal conditions there will be a plurality of security elements with impedances. It may thus be expected that all impedances, or at least a number of them, must be compared with the corresponding reference values before the authenticity of the semiconductor device can be recognized completely.

It is being recognized that, before the actual value is compared with the first reference value, it may be modified in accordance with an algorithm. For example, the actual value may be multiplied by an integer value so as to create a value that is in the range between 0 and 1000. Alternatively, the actual value may modified so as to create an integer, or it could be digitized. If there is a modifying algorithm, it will be implemented in the semiconductor device, such that it cannot be adapted. In this way it is assured that the actual value and the first reference value are modified in the same way.

The predefined threshold value is generally very small, about 3 to 5%, and may depend on the number of security elements as well as on other design parameters. It is defined in order to correct uncertainties of measurement or influences of temperature and other external conditions.

It is a sixth object of the invention to provide a method of ascertaining the identity of a semiconductor device with an identity code that is not stored in the semiconductor device. This object is achieved in a method of identifying the semiconductor device of the invention in the system of the invention, which semiconductor device:

has been initialized by storing the actual values of the first and the second impedances as first and second reference values in the first and second memory elements respectively, and has an identity at least partially defined by a combination of the actual values of the first and the second impedance, which method comprises the steps of:

measuring the actual values of the first and the second impedance, transferring the actual values to the central database device;

recognizing the identity of the semiconductor device, if at least the difference between the actual value and the first reference value is smaller than a predefined threshold value.

This method of identification allows the reversal of identification and security features. In the case of the identification of the owner of a bank account, for example, the combination of actual values may be used as the identity. The bank account number may be provided by the owner subsequently, and be used as a security feature. Alternatively, the method of the invention may be used for providing access to a building, or to a specific set of data. In this case, the combination of actual values may be used as the main identification tool. This combination of actual values is also called the unique chip identifier code. This may be desired especially in those cases, in which a user does not want to be identified by the system as a specific person. This may be the case, for example, with a medical file archive.

It is noted here that under normal conditions there will be a plurality of security elements with impedances. It may thus be expected that all impedances, or at least a number of them, must be compared with the corresponding reference values before the authenticity of the semiconductor device can be recognized completely. It is further noted here, that other identification processes may be used in addition to the method of the invention. The combination of actual values is then only a part of the identification code.

It is being recognized that, before the actual value is compared with the first reference value, it may be modified in accordance with an algorithm. For example, the actual value may be multiplied with an integer value so as to create a value that is in the range between 0 and 1000. Also, the actual value may be modified, so as to create an integer, or it could be digitized. If there is a modifying algorithm, it will be implemented in the semiconductor device, such that it cannot be adapted. In this way it is assured that the actual value and the first reference value are modified in the same way.

The predefined threshold value is generally very small, about 3 to 5%, and may depend on the number of security elements as well as on other design parameters. It is defined in order to correct uncertainties of measurement or influences of temperature and other external conditions.

These and other aspects of the system, the semiconductor device, the card, the method of initializing, and the method of checking the authenticity of the invention will be further explained with reference to the Figures, of which:

Figure 1:
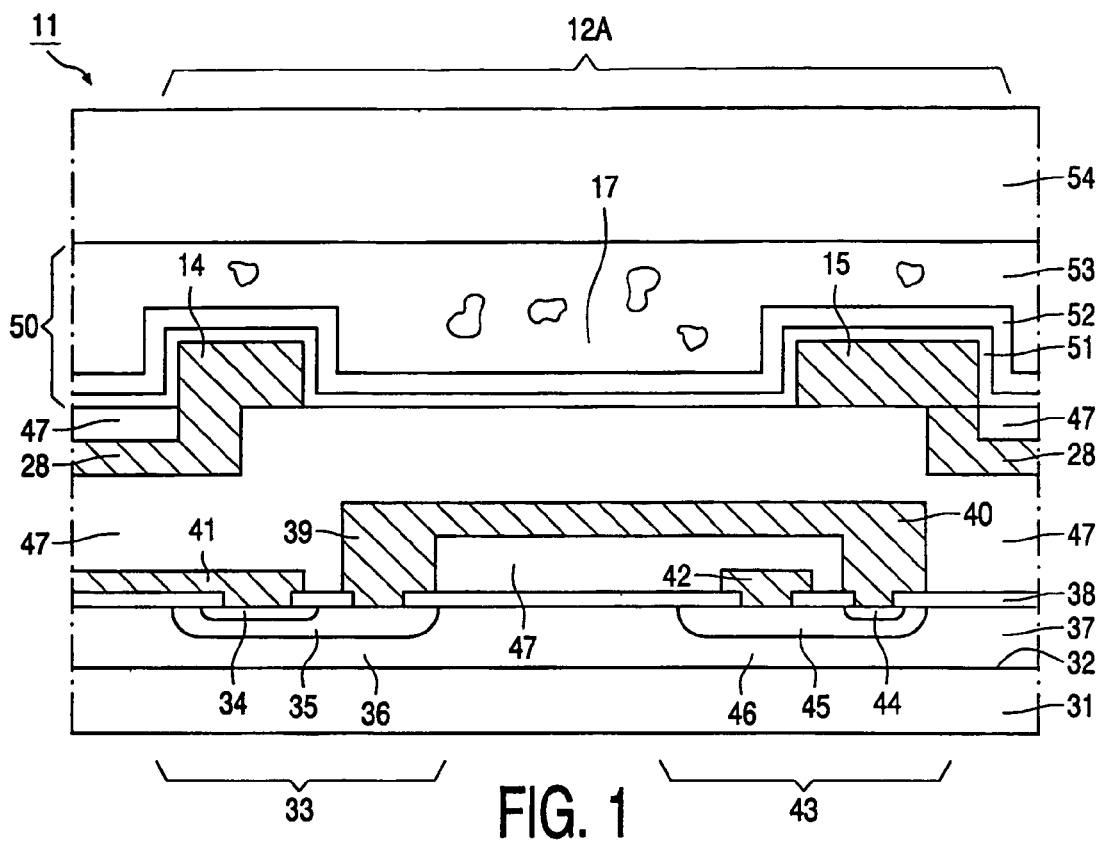
FIG. 1 is a diagrammatical cross-sectional view of a first embodiment of the semiconductor device.

The Figures are schematically drawn and not true to scale, and the identical reference numerals in different Figures refer to corresponding elements. It will be clear those skilled in the art, that alternative but equivalent embodiments of the invention are possible without deviating from the true inventive concept, and that the scope of the invention will be limited by the claims only.

In FIG. 1, the semiconductor device 11 has a substrate 31 of silicon, with a first side 32. On this side 32, the device 11 is provided with a first active element 33 and a second active element 43. These active elements 33, 43 in this example are bipolar transistors with emitter regions 34, 44, base regions 35, 45, and collector regions 36,46.

Said regions 34-36, 44-46 are provided in a first layer 37 which is covered with a patterned insulating layer 38 of silicon oxide. The insulating layer 38 is patterned such that it has contact windows at the emitter regions 34, 44 and the base regions 35, 45. As is known to those skilled in the art, field effect transistors may be present instead of or besides the bipolar transistor. As is further known to those skilled in the art, other elements, such as capacitors, resistors, and diodes may be integrated in the semiconductor device 11.

At these contact windows in the insulating layer 38, the said regions are connected to interconnects 39, 40, 41, 42. The interconnects in this embodiment extend at a first level and a second level. As is generally known, the interconnect structure may contain more levels. A barrier layer (not shown) is generally present between the interconnects and the active elements. The interconnects 39, 40,41,42 are manufactured, for example, in Al or in Cu in a known manner with and are covered and mutually insulated by dielectric layers 47 that preferably have a low dielectric constant. Additionally present barrier layers are not shown. Another metal layer 28, is present in between these dielectric layers 47. In this metal layer 28, the electrodes 14,15 of the first security element 12A are defined at a mutual distance of 4 µm. The first security element further comprises a dielectic 17, constituted as a local area of the passivation structure 50. This passivation structure in this embodiment comprises an adhesion layer 51 of phosphorus silicate glass in a thickness of 0.50 µm, a passivating layer 52 of SiN in a thickness of 0.60 µm, and a security layer 53 of monoaluminum phosphate in a thickness of 3.0 µm. This layer was applied by spincoating of a composition of 15% by weight of monoaluminum phosphate, 20 to 50% by weight of particles in water, and subsequent drying at about 100 to 150° C. Alternatively, it may be applied by spraycoating of a composition of 5 to 10% by weight of monoaluminum phosphate. After drying, the layer is annealed at 400 to 500° C. to allow condensation, due to which a transition from the liquid to the solid phase takes place. The security layer 53 is planarized, and an epoxy material is present thereon as a package 54. The security layer 53 may be patterned so as to define contact pads for connection to a PCB, for example.

The particles contained in the security layer 53 are $TiO_2$, TiN, $SrTiO_3$ and/or modified $BaTiO_3$. Such modified $BaTiO_3$ is disclosed, for example, in U.S. Pat. No. 6,078,494. Relative dielectric constants and conductivities of these particles and the other materials in the passivation structure 50 are shown in Table 1.

TABLE 1 relative dielectric constants (relative to that of vacuum) and conductivities of several materials which may be present in the passivation structure

| type of action: | compound: | dielectric constant ($\epsilon_r$): | Conductivity (µΩ cm) |
|---|---|---|---|
| Dielectric | SiN | 8 | — |
| Dielectric | phosphorus silicate glass | 4.2 | — |
| Dielectric | monoaluminum phosphate | 5 | — |
| Dielectric | air | ~1 | — |
| Dielectric | $SiO_2$ | 4.2 | — |
| Dielectric | mesoporous methylsubstituted $SiO_2$ | 1.9-2.3 | — |
| Conductive | TiN | — | 21.7 |
| Conductive | C (graphite) | — | 65 |
| Dielectric | $TiO_2$ | ~100 | — |
| dielectric (ferroelectric) | $SrTiO_3$ | ~300-400 | — |
| Dielectric | modified $BaTiO_3$ | ~25.000 | — |

Figure 2:
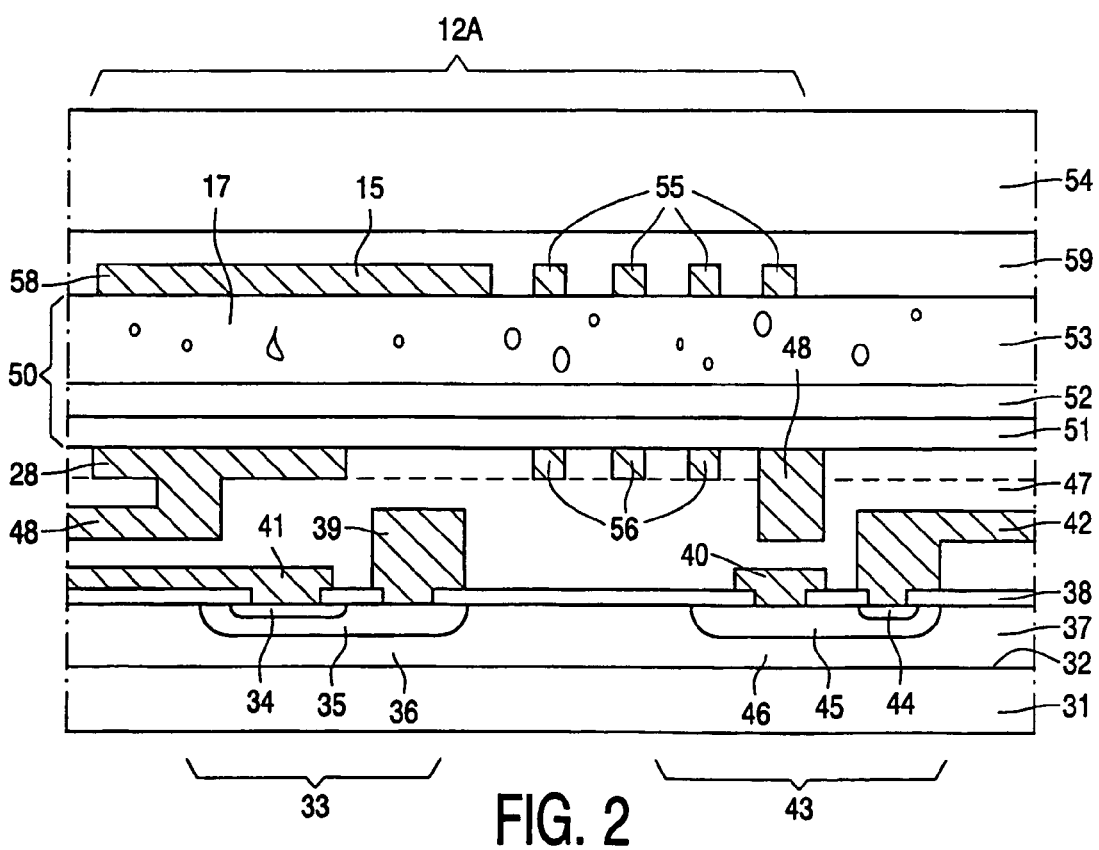
FIG. 2 is a diagrammatical cross-sectional view of a second embodiment of the semiconductor device.

FIG. 2 shows a second embodiment of the semiconductor device 11 of the invention. In the device 11 of this embodiment, the first security element 12A is an LC-structure which comprises a capacitor with a first electrode 14, second electrode 15, and a dielectric 17, and a coil with two windings 55, 56. Contrary to the embodiment of FIG. 1, the first and the second electrode 14, 15 are not present in the same layer on the same side of the passivation structure 50. The first electrode 14 and the second winding 56 are present in the metal layer 28 between the passivation structure 50 and the active elements 33, 43. Both the first electrode 14 and the second winding 56 are connected to further circuitry through interconnects 48. The second electrode 15 and the first winding 55, which are mutually connected, are present in an additional metal layer 58 between the passivation structure 50 and the package 54. The additional metal layer 58 is protected against the package 54 by an additional passivating layer 59.

Figure 3:
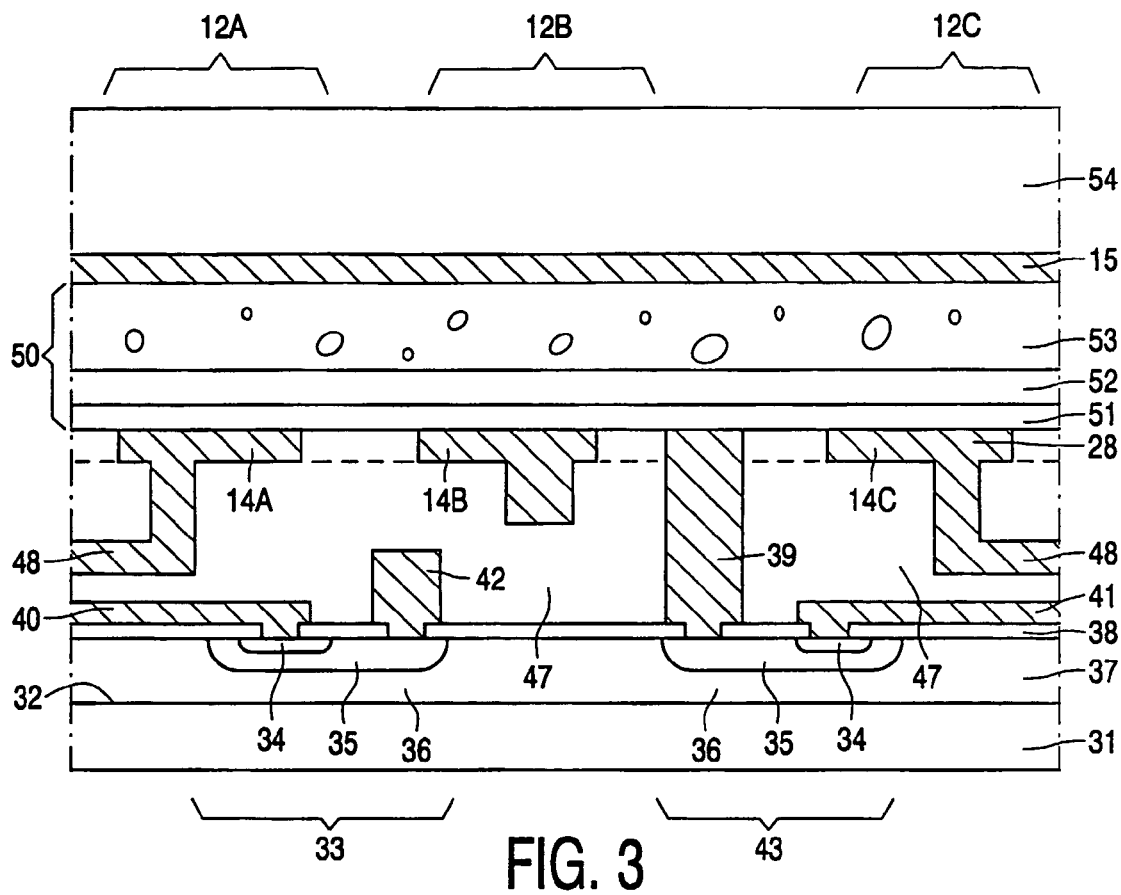
FIG. 3 is a diagrammatical cross-sectional view of a third embodiment of the semiconductor device.

FIG. 3 shows a third embodiment of the semiconductor device 11 of the invention. The device 11 of this embodiment comprises a first security element 12A, a second security element 12B, and a third security element 12C. All of these security elements 12A, 12B, 12C are capacitors with a common second electrode 15 that is connected to a ground plane. The security elements 12A, 12B, 12C have different first electrodes 14A, 14B, 14C. These may very well be integrated in an array, as will be further explained with reference to FIG. 5.

Figure 4:
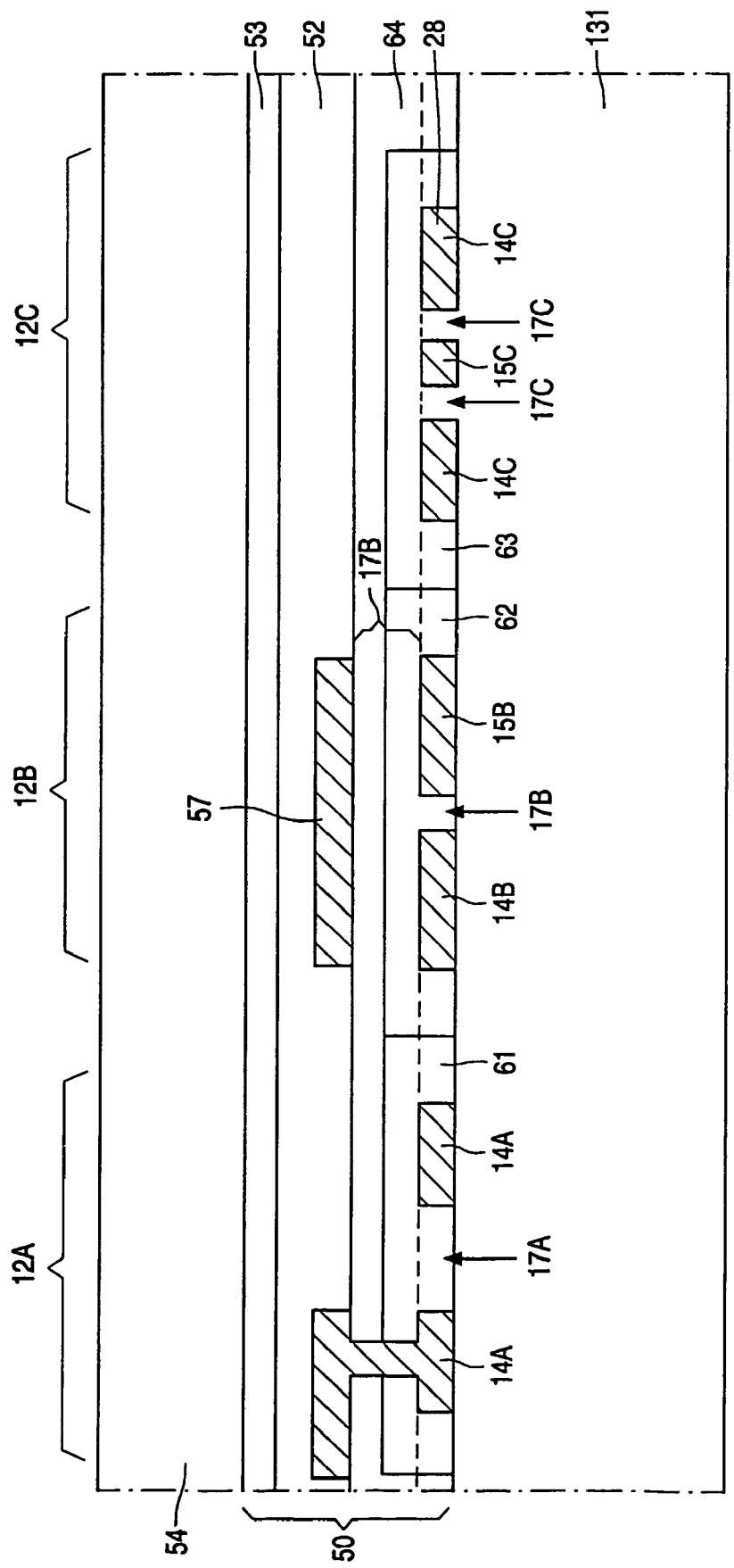
FIG. 4 is a diagrammatical cross-sectional view of a fourth embodiment of the semiconductor device.

FIG. 4 shows a fourth embodiment of the semiconductor device 11 of the invention. In the drawing, the total assembly of layers 31,37 to 42, 47, and 28 is shown as a substrate 131. The device 11 of this embodiment comprises a first, second, and third security element 12A, 12B, 12C. The passivation structure 50 of this embodiment comprises patterned layers 61, 62, 63 of various materials, an intermetal dielectric layer 64 of $SiO_2$, a passivating layer 52 of SiN, and a security layer of TiN.

The first security element 12A is a capacitor and has a first and a second electrode 14A, 15A which are both present in the metal layer 28. The dielectric 17A is a portion of the patterned layer 61 made of methyl substituted mesoporous $SiO_2$, obtained from a mixture of tetraethoxyorthosilicate (TEOS) and methyltrimethoxysilane (MTMS) in a molar ratio of 1:1 with a non-polar surfactant. It has a relative dielectric constant of 2.0. The distance between the electrodes 14A, 15A is 2.0 µm, the length of the electrodes is 10 µm, and the height of the electrodes is 0.7 µm. The first security element 12A thus has a capacitance of $6,3.10^{-5}$ pF, as calculated without having regard to any stray capacitance.

The second security element 12B is a capacitor and has a first and a second capacitor electrode 14B, 15B which are present in the metal layer 28, as well as an intermediate capacitor electrode 57. The dielectric 17B comprises a portion of the intermetal dielectric layer 64 of $SiO_2$ and the patterned layer 62 of SiN. The distance between the first and second electrodes 14B, 15B is 0.5 µm, the length of the electrodes is 40 µm, and the height of the electrodes is 0.7 µm. The width of the electrodes is 20 µm, and the distance between the electrodes 14B, 15B and the intermediate electrode 57 is 0.1 µm (0.04 µm SiN and 0.06 µm $SiO_2$). The second security element 12B thus has a capacitance of $2.40.10^{-2}$ pF, as calculated without having regard to any stray capacitance.

The third security element 12C is a capacitor and has a first and a second capacitor electrode 14C, 15C which are both present in the metal layer 28. The dielectric 17C has the shape of a channel and is a portion of the patterned layer 63 of $SiO_2$. The distance between the first and second electrodes 14B, 15B is 0.5 µm, the length of the channel is 100 µm, and the height of the electrodes is 0.7 µm. The third security element 12C thus has a capacitance of $5.4.10^{-3}$ pF, as calculated without having regard to any stray capacitance.

Figure 5:
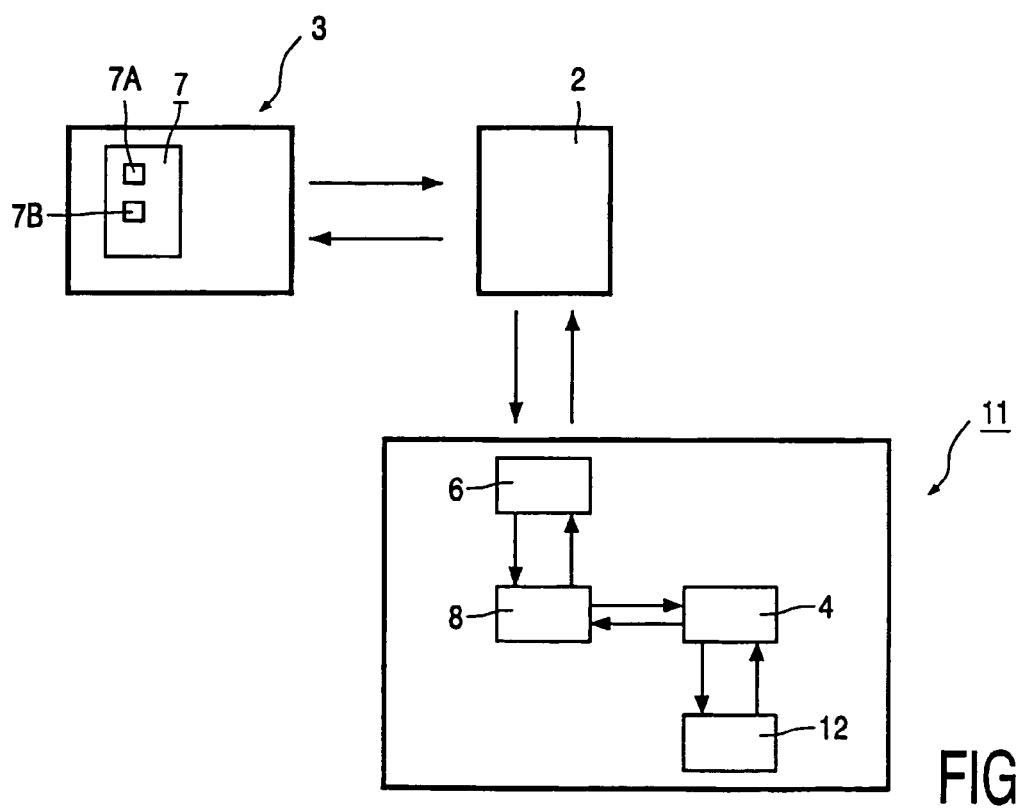
FIG. 5 is a schematic diagram of the system.

FIG. 5 is a diagram of an embodiment of the semiconductor device 11 together with an access device 2. The semiconductor device 11 comprises measuring means 4, control means 8, and transferring means 6. Furthermore, the semiconductor device comprises a plurality of security elements 12. The control means 8, may be a microprocessor or a dedicated circuit. The control means 8 need not be dedicated solely to the control of the measurment of the impedances of the security elements 12, but may control the operation of the complete semiconductor device 11, including a memory with financial or identification data The security elements 12 are capacitors in this example and are connected to a ground plane at one side.

The access device 2 is generally a card reader, but may be some other device, for example an apparatus with which the initialization is performed. It comprises or is connected to a central database device 3. Also, some information of the central database device 3 may be stored in a local memory. This central database device 3 contains a memory 7 with memory elements 7A, 7B, 7C, . . . , in which the actual values of the security elements 12A, 12B, 12C can be stored as the reference values. The memory is of a conventional type and comprises a read and storage control for reading and storing. A verification control 9 is present for comparing any actual value with a reference value. It may be, that not all actual values are measured, but only a portion thereof. If it should turn out that the difference between actual values and reference values of this portion is substantially equal to zero, then the measurement of the impedances of the other security elements 12 can be abandoned under certain conditions.

The circuit in the semiconductor device 11 functions as follows: a signal is sent from the access device 2 to the semiconductor device 11, requesting the measurement of the actual value of the first security element 12A, and probably also the actual values of the other or some other security elements 12B, 12C, . . . . This signal enters the control means 8. The control means 8 will send a signal to the measuring means 4, indicating that the security elements 12 must be measured. It is preferred that this signal is a signal with which the first security element 12 can be selected, measured, and stored; in this case a microprocessor need not be included in the measuring means 4. In this preferred embodiment, the number of signals from the control means to the measuring means 4 will be equal to or greater than the number of security elements 12. After being measured, the actual value of the first impedance may be stored in a volatile memory in the control means 8, or it may be sent to the access device 2 directly.

The access device 2 will provide the actual value of the first impedance to the central database unit 3. During of initialization, the actual value will be stored as the first reference value in the first memory element 7A. During checking of the authenticity of the semiconductor device 11, the actual value will be compared with the first reference value, which is read from the first memory element 7A. During of identification of the semiconductor device, the first reference value will be compared with the first reference values of various semiconductor devices. Preferably, the memory 7 is a database, and a search may be made therein.

On comparing the actual value and the first reference value the authenticity or the identity of the semiconductor device 11 will be recognized only, if the difference between the two values is smaller than a predefined threshold value, for example 3%. The predefined threshold value will be dependent on the precision of the measuring means. It could alternatively be 10 or 20%, especially if the number of security elements is large, for example 10 or more. It could be alternatively less than 1%.

Figure 6:
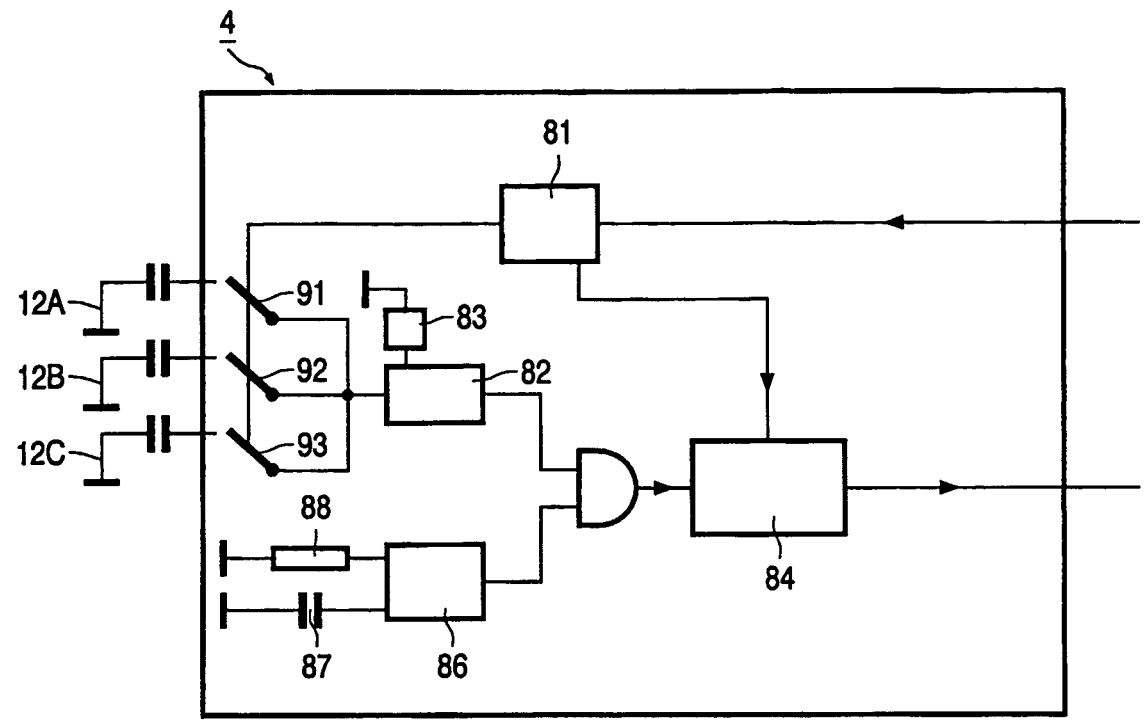
FIG. 6 shows an embodiment of the measuring means of the semiconductor device.

FIG. 6 shows a first embodiment of the measuring means 4 of the semiconductor device 11. The security elements 12A, 12B, and 12C are shown as well. The measuring means 4 of this embodiment measure the imaginary part of the impedance of the security elements 12. In fact, the oscillator 82 provides a signal to a counter 84, whose frequency depends on said imaginary part of the measured security element 12. The counter 84 compares this frequency with a signal having a clock frequency. This signal originates from oscillator with a capacitor 87 and a resistor 88 which both have a precise and well-known value. The result of the comparison in the-binary-counter 84 is a digitized signal which can be stored. The digitized signal represents the actual value of the impedance of the measured security element 12. The actual value may be present in any kind of SI-unit, or else in any semiconductor specific value, as it will not be compared with any externally measured value. A selection unit 81 is present for selecting which security element 12A, 12B, 12C is to be measured. It will send signals such that one of the switches 91, 92, 93 is on, and one of the security elements 12A, 12B, 12C is measured. The switches are preferably transistors. Alternatively, a desired combination of security elements 12 may be measured so as to minimize the number of measuring steps or to complicate the security. This simultaneous multiple measurement is to be understood as equivalent to measuring the actual value of the first security element 12A in the context of this application. The selection unit also provides a signal to the counter 84 after a measuring step so as to clear its result.

The selection unit 81 may be part of the control means 8. Furthermore, the oscillator 86 may be embodied as the clock generator of the semiconductor device 11. In that case it may be absent in the measuring means 4 and its signal may be sent to the counter 84 via the control means 8. In order to obtain actual and reference values that are precise enough, such that the difference between them is lower than a threshold value of 3-5%, the oscillators 82, 86 are adjusted so as to be correct to within approximately 1%. This is done in a usual manner known to the skilled person, and preferably by the provision of an adequate design.

It is preferred that the security element 12C is a reference element whose actual value is known. It may be realized, for example, by implementing this element 12C in the interconnect structure; especially if the passivation structure 50 comprises a security layer 53 with particles that are distributed inhomogeneously. This reference security element 12C can be used for optimizing the measuring results and for any performing deduction of actual values from the results of the binary counter 84, if applicable.

Figure 7:
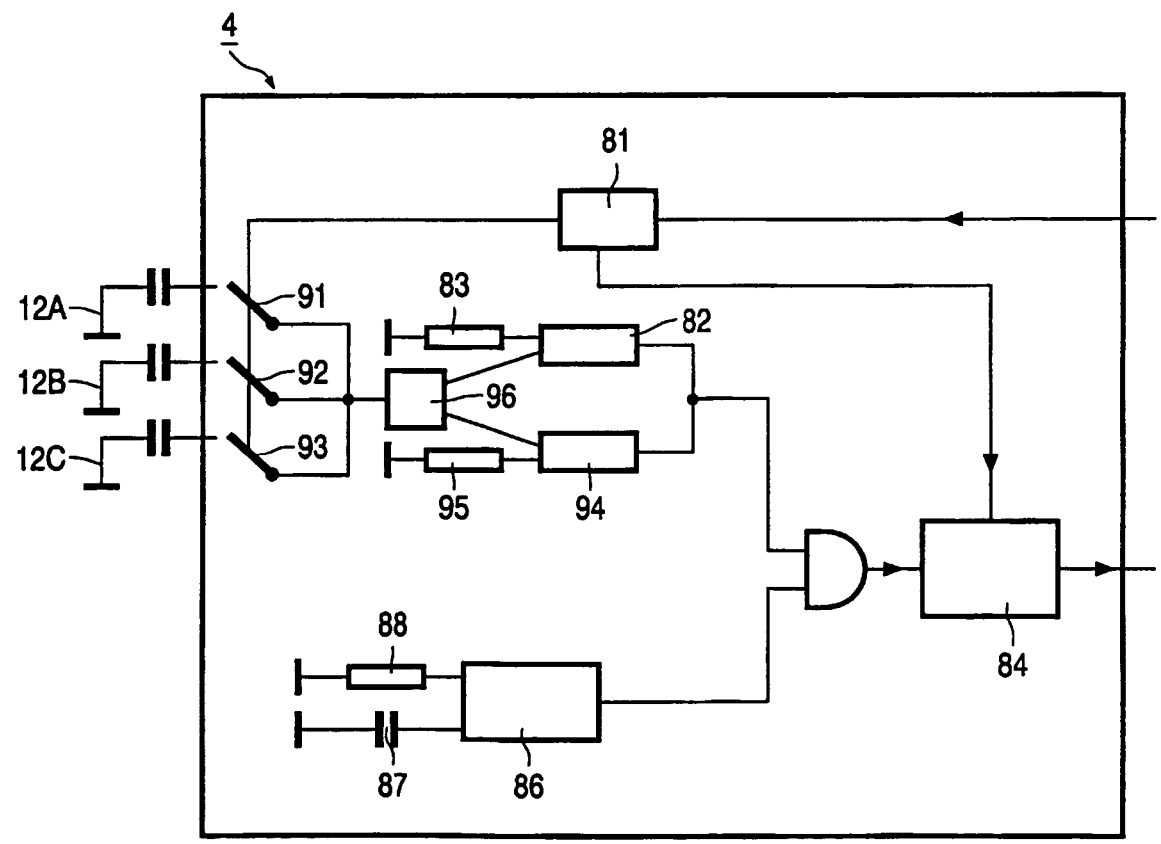
FIG. 7 shows another embodiment of the measuring means of the semiconductor device.

FIG. 7 shows a second embodiment of the measuring means 4 of the semiconductor device 11, which is largely identical to the first embodiment. In this case a second oscillator 94 with a resistor 95 is provided, as well as a switch 96. Here the selection unit 81 does not only select the security element 12A, 12B, 12C that is to be measured, it also selects the oscillator 82, 94 with which the security element 12A, 12B, 12C is to be measured. As the oscillators 82, 94 will be scaled differently, their frequencies will differ. Hence, the embodiment renders it possible to measure the impedance at two frequencies. Both of the resulting actual values may be transferred to the access device 2. These values may be mutually compared in a comparator placed functionally behind the binary counter 84.

The semiconductor device of the invention comprises a circuit covered by a passivation structure. It is provided with a first and a second security element which comprise local areas of the passivation structure, and with a first and a second electrode. The security elements have a first and a second impedance, respectively, which impedances differ. This is realized in that the passivation structure has an effective dielectric constant that varies laterally over the circuit.

Actual values of the impedances are measured by measuring means and transferred to an access device by transferring means. The access device comprises or has access to a central database device for storing the impedances. The access device furthermore on may compare the actual values with the stored values of the impedances in order to check the authenticity or the identity of the semiconductor device.

The invention claimed is:

1. A semiconductor device provided with a circuit comprising an active element, which circuit is present at a side of a substrate and is covered by a passivation structure, which semiconductor device is further provided with a first security element, comprising a first local area of the passivation structure and having a first impedance, and with a second security element, comprising a second local area of the passivation structure and having a second impedance, each of which security elements is provided with a first and second electrode, characterized in that:

measuring means are present for measuring actual values of the first and second impedance; and transferring means are present for transferring the actual values to an external access device comprising or having access to a central database device.

2. A semiconductor device as claimed in claim 1, characterized in that algorithm means are present to modify the actual value as measured according to a predefined algorithm into the actual value as transferred.

3. A semiconductor device as claimed in claim 1, characterized in that the passivation structure has an effective dielectric constant that varies laterally over the circuit, such that the first impedance is different from the second impedance.

4. A semiconductor device as claimed in claim 3, characterized in that the passivation structure comprises a passivating layer and a security layer, which security layer comprises a carrier material and particles which are distributed inhomogeneously over the circuit.

5. A semiconductor device as claimed in claim 3, characterized in that:

the passivation structure is present on top of a metal layer, and the first and second electrodes of the security elements are present in the metal layer and constitute a pair of interdigitated electrodes.

6. A system comprising a semiconductor device and an access device, characterized in that:

the semiconductor device as claimed in claim 1 is present;

the access device comprises or has access to a central database device; and the central database device comprises memory elements which are suitable to store the actual values of the first and the second impedances as first and second reference values respectively.

7. A card provided with a semiconductor device as claimed in claim 1.

8. A method of initializing the semiconductor device as claimed in claim 1, wherein:

actual values of the first and the second impedance are measured; and the actual values are transferred to a central database device to be stored as first and second reference values in first and second memory element, respectively.

9. A method of recognizing the authenticity of a semiconductor device as claimed in claim 1, which semiconductor device has been initialized by storing the actual values of the first and the second impedance as first and second reference values in first and second memory elements, respectively, which method comprises the steps of:

measuring the actual value of the first impedance, transferring the actual value to an access device;

providing the identity of the semiconductor device to a central database device;

reading the first reference value corresponding to the identity of the semiconductor device, providing the first reference value from the central database device to the access device, and recognizing the authenticity of the semiconductor device, if the difference between the actual value and the first reference value is smaller than a predefined threshold value.

10. A method of identifying a semiconductor device according to claim 1, which semiconductor device:

has been initialized by storing the actual values of the first and the second impedance as first and second reference values in first and second memory elements, respectively, and has an identity at least partially defined by a combination of the actual values of the first and the second impedance, which method comprises the steps of:

measuring the actual values of the first and the second impedance, transferring the actual values to a central database device;

recognizing the identity of the semiconductor device, if at least the difference between the actual value and the first reference value is smaller than a predefined threshold value.

11. A method as claimed in claim 8, characterized in that the before transferring the actual value as measured it is modified according to a predefined algorithm into the actual value as transferred.

12. The semiconductor device of claim 1 wherein the measuring means comprises:

an oscillator and a counter;

wherein the oscillator provides a first signal to the counter, the frequency of the first signal being dependent on an imaginary part of the impedance of one of the first and second security elements; and wherein the counter compares the frequency of the first signal with a second signal having a clock frequency, the result of the comparison being a digitized signal representative of the actual value of the impedance of the measured security element.

13. The semiconductor device of claim 12 further comprising a selection unit for selecting which of the first and second security elements is to be measured by the measuring means.

14. The semiconductor device of claim 13 further comprising switches corresponding to the first and second security elements, wherein the switches are controlled in response to signals from the selection unit.

* * * * *